Figure 1:
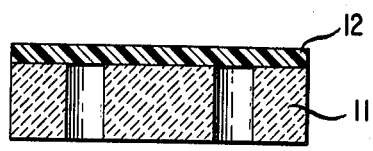

United States Patent [19]

Griffith et al.

[11] 4,226,659
[45] Oct. 7, 1980

[54] METHOD FOR BONDING FLEXIBLE PRINTED CIRCUITRY TO RIGID SUPPORT PLANE

[75] Inventors: Gary L. Griffith, Arvada; Nawal K. Sharma, Broomfield, both of Colo.

[73] Assignee: Bell Telephone Laboratories, Incorporated, Murray Hill, N.J.

[21] Appl. No.: 754,122

[22] Filed: Dec. 27, 1976

Related U.S. Application Data

[63] Continuation of Ser. No. 648,288, Jan. 12, 1976, abandoned.

[51] Int. Cl.$^2$ .............................................. B41M 3/08
[52] U.S. Cl. ..................................... 156/305; 29/834;
156/155; 156/253; 156/330
[58] Field of Search ............... 156/297, 299, 300, 305, 156/306, 155, 253, 330; 29/624, 625, 626

[56] References Cited

U.S. PATENT DOCUMENTS

| 3,348,990 | 10/1967 | Zimmerman et al. | 156/297 |
| 3,606,677 | 9/1971 | Ryan | 29/625 |
| 3,804,692 | 4/1974 | Sly | 156/300 |

*Primary Examiner*—John E. Kittle
*Attorney, Agent, or Firm*—Edward M. Fink

[57] ABSTRACT

A technique is described for bonding flexible printed circuitry to a rigid base plane by means of a tacky contact adhesive which is subsequently cured by heating into a nontacky condition. The procedure involves pressing the adhesive on the surface of a rigid support member to which it adheres and subsequently applying a flexible sheet thereto and laminating under moderate pressure. The adhesive is then removed from through holes with a solvent and the resultant assembly subjected to heating to cure the adhesive. It has been found that the use of this procedure permits removal of the solvent without detrimental solvent retention and also avoids the collecting of debris at the edge of the adhesive layer during subsequent processing and use.

2 Claims, 3 Drawing Figures

METHOD FOR BONDING FLEXIBLE PRINTED CIRCUITRY TO RIGID SUPPORT PLANE

This is a continuation of application Ser. No. 648,288 filed Jan. 12, 1976, now abandoned.

This invention relates to a technique for bonding flexible printed circuitry to a rigid base plane. More particularly, the present invention relates to a technique for laminating flexible bonded circuits onto rigid epoxy coated support planes.

In the fabrication of flexible printed circuits a flexible dielectric sheet having printed circuit patterns on both of its sides and having electrical through connections between the patterns on both surfaces in the form of metal plated holes, is bonded to a rigid support plane by means of an adhesive. It is, of course, necessary that the rigid support member have holes in the same position as those in the flexible printed sheet, that the holes in the support and the flexible sheet be in accurate registry with each other and that the holes be kept free of any bonding adhesive which might interfere with proper connection of leads or components such as resistors or capacitors which are inserted in the holes. It is also important that the adhesive be removed in order to ensure that the adhesive does not interfere with the soldering of the component leads to the bonded flexible circuit.

Heretofore, the adhesive normally employed for this purpose was applied as a continuous layer on the surfaces and in the holes of a printed circuit sheet. Removal of the adhesive from the holes and unwanted areas was subsequently effected either by mechanical removal or by means of a solvent. Each of these procedures proved to be less than totally satisfactory, the former being laborious in nature and the latter oftimes resulting in the presence of large pools of solvent in the adhesive layer. In those cases in which adhesive films of limited thickness were employed and in which curing under pressure in an alignment jig is required, added equipment needs increased the cost of the process.

In accordance with the present invention, these prior art limitations are effectively obviated by a novel procedure wherein a curable contact adhesive is employed. The adhesive is a commercially available, paperbacked composition which can be removed from through holes with a solvent prior to curing and after assembly, the curing operation eliminating the deleterious effects of solvent penetration through the adhesive layer.

Figure 2:
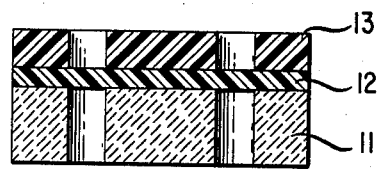
Figure 3:
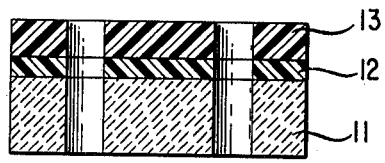

The invention will be more readily understood by reference to the following detailed description taken in conjunction with the accompanying drawing wherein FIG. 1 is a front elevational view in cross section of a rigid support member bearing an adhesive in accordance with the present invention;

FIG. 2 is a front elevational view in cross section of the structure of FIG. 1 after deposition thereon of a flexible printed circuit; and FIG. 3 is a front elevational view in cross section of the structure of FIG. 2 after curing of the adhesive to a nontacky state.

The materials selected for use in the operation of the present process include (a) an epoxy coated rigid support member,
(b) flexible printed circuitry having metallic circuit patterns on both sides thereof and conductively plated through holes, and
(c) tacky contact adhesive which can be subsequently cured by heating to a non-tacky condition.

With reference now more particularly to FIG. 1, there is shown a rigid support member 11 comprising an epoxy coated steel or epoxy glass sheet, such member being available from commercial sources. The epoxy resin chosen for coating the support member is not critical and may be selected from among any epoxy resin evidencing good electrical characteristics and which may readily be deposited by fluidized bed or spray techniques. Shown deposited upon support member 11 is a tacky paperbacked contact adhesive 12 which is capable of being cured by heating to a nontacky condition. Adhesives meeting this requirement are readily available commercially and typically comprise rubber modified epoxy containing approximately three percent of dispersed polyester fibers. In fabricating the structure of interest, the adhesive side of the paperbacked adhesive is pressed against the surface of the rigid support sheet or the flexible circuit to which it then adheres and the backing is stripped away. Depending on the surface properties of the surface to which the adhesive is applied, it may be necessary to pass the paper carrier, adhesive, adherent composite under a heated roller (160° F.) prior to removing the paper carrier.

Following, the flexible sheet of printed circuitry 13 (FIG. 2) is aligned upon the support plane with an alignment fixture which uses cylindrical pins that can protrude through corresponding holes in the support plane and the flexible circuit, thereby permitting proper positioning of the flexible circuit. The flexible circuitry may be firmly attached to the support plane under moderate pressure and the alignment fixture removed, the tackiness of the adhesive maintaining the alignment of the circuit through all subsequent operations.

The resultant laminated assembly is then passed through pressure rolls which supply sufficient pressure to form a thorough bond. It may be desirable to preheat the structure to enhance the flow of the adhesive during the rolling operation, thereby ensuring adequate wetting of the adherent surfaces.

Next, the adhesive is selectively removed from component hole locations by chemical dissolution in a solvent, typically a chlorinated hydrocarbon, trichloroethylene 1-1-1, trichloroethane, methylene chloride and the like. This end may be readily effected by means of a solvent spray machine such as those employed in developing photoresists or by dipping and agitating in a solvent bath. During this process, the polyester fibers contained in the adhesive are not removed. However, they are of limited diameter and are so few in number that their residual presence creates no deterrent to further processing. The next step in the fabrication of the desired printed structure involves curing the adhesive to a nontacky state by heating in air at a bond line temperature within the range of from 320° to 345° F. for a time period ranging from 35 to 45 minutes, the shorter time period corresponding with the higher temperature and the converse. Depending on the geometry of the flexible circuit, certain edges may tend to slightly raise from the support base during the curing operation. If this problem does arise it may be solved by laying a flat metal sheet over the assembly having a weight of approximately 0.05 hbs/in$^2$. The metal sheet keeps the flexible circuit in intimate contact with the support base. The resultant structure is shown in FIG. 3.

Studies have revealed that the use of the foregoing procedure permits the removal of solvent without detrimental solvent retention, solvent absorbed during the removal operation being driven from the adhesive during curing. The curing step also has been found to eliminate another disadvantage of the permanently tacky adhesive in that it does not tend to collect debris at the edge of the adhesive layer during subsequent processing and use.

We claim:

1. A method of forming a printed circuit device comprising a rigid perforate substrate having an insulating surface bonded to one face of a two-faced flexible insulating sheet having thin conductive patterns produced on each of said faces, said flexible sheet having conductive through holes electrically connecting portions of the pattern on one face to portions of the pattern on the opposite face, which comprises the steps of:

(a) depositing a layer of a tacky contact adhesive comprising a rubber modified epoxy resin containing dispersed polyester fibers upon the rigid perforate substrate member, (b) aligning said flexible insulating sheet upon the epoxy resin-coated surface of the substrate, (c) attaching the flexible insulating sheet to the epoxy resin-coated surface of the substrate by applying sufficient pressure thereto to establish a firm contact bond, (d) selectively removing adhesive in the through holes with a solvent selected from the group consisting of 1,1,1-trichloroethylene, trichloroethane and methylene chloride, thereby resulting in registration of through holes in the sheet with perforations in the rigid substrate, and (e) curing the adhesive to an insoluble state.

2. Method in accordance with claim 1 wherein curing is effected at a bond line temperature within the range of 320°–345° F. for a time period ranging from 35–45 minutes, the shorter time periods corresponding with the higher temperatures, and the converse.

* * * * *